(12) United States Patent
Sasaoka et al.

(10) Patent No.: US 11,810,783 B2
(45) Date of Patent: Nov. 7, 2023

(54) GALLIUM NITRIDE SEMICONDUCTOR DEVICE AND METHOD FOR MANUFACTURING THE SAME

(71) Applicants: DENSO CORPORATION, Kariya (JP); HAMAMATSU PHOTONICS K.K., Hamamatsu (JP); National University Corporation Tokai National Higher Education and Research System, Nagoya (JP)

(72) Inventors: Chiaki Sasaoka, Nagoya (JP); Jun Kojima, Nagoya (JP); Shoichi Onda, Nagoya (JP); Masatake Nagaya, Kariya (JP); Kazukuni Hara, Kariya (JP); Daisuke Kawaguchi, Hamamatsu (JP)

(73) Assignees: DENSO CORPORATION, Kariya (JP); HAMAMATSU PHOTONICS K.K., Hamamatsu (JP); National University Corporation Tokai National Higher Education and Research System, Nagoya (JP)

( * ) Notice: Subject to any disclaimer, the term of this patent is extended or adjusted under 35 U.S.C. 154(b) by 80 days.

(21) Appl. No.: 17/229,141

(22) Filed: Apr. 13, 2021

(65) Prior Publication Data
US 2021/0327710 A1     Oct. 21, 2021

(30) Foreign Application Priority Data
Apr. 15, 2020  (JP) ................................. 2020-073158

(51) Int. Cl.
*H01L 33/00* (2010.01)
*H01L 21/02* (2006.01)
(Continued)

(52) U.S. Cl.
CPC .... *H01L 21/02389* (2013.01); *H01L 21/0254* (2013.01); *H01L 21/02694* (2013.01);
(Continued)

(58) Field of Classification Search
CPC . H01L 29/2003; H01L 29/454; H01L 29/452; H01L 21/0254; H01L 21/02389;
(Continued)

(56) References Cited

U.S. PATENT DOCUMENTS

| 2003/0141506 A1 | 7/2003 | Sano et al. |
| 2004/0104390 A1 | 6/2004 | Sano et al. |

(Continued)

FOREIGN PATENT DOCUMENTS

JP    2009-163838 A    7/2009

OTHER PUBLICATIONS

U.S. Appl. No. 17/229,137, filed Apr. 13, 2021, Nagaya et al.
(Continued)

*Primary Examiner* — Reema Patel
(74) *Attorney, Agent, or Firm* — POSZ LAW GROUP, PLC

(57) ABSTRACT

A gallium nitride semiconductor device includes: a chip formation substrate made of gallium nitride and having one surface and an other surface opposite to the one surface; a one surface side element component disposed on the one surface and providing a component of an one surface side of a semiconductor element; and a metal film constituting a back surface electrode in contact with the other surface. The other surface has an irregularity provided by a plurality of convex portions with a trapezoidal cross section and a plurality of concave portions located between the convex portions; and an upper base surface of the trapezoidal cross section in each of the plurality of convex portions is opposed to the one surface.

8 Claims, 9 Drawing Sheets

(51) Int. Cl.
  *H01L 29/20* (2006.01)
  *H01L 29/45* (2006.01)
  *H01L 29/40* (2006.01)
  *H01L 21/306* (2006.01)

(52) U.S. Cl.
  CPC .... *H01L 21/30625* (2013.01); *H01L 29/2003* (2013.01); *H01L 29/401* (2013.01); *H01L 29/454* (2013.01)

(58) Field of Classification Search
  CPC ............. H01L 21/2007; H01L 33/0093; H01L 2221/68318
  See application file for complete search history.

(56) References Cited

U.S. PATENT DOCUMENTS

| | | |
|---|---|---|
| 2005/0035364 A1 | 2/2005 | Sano et al. |
| 2005/0211993 A1 | 9/2005 | Sano et al. |
| 2006/0001046 A1 | 1/2006 | Batres et al. |
| 2006/0001056 A1 | 1/2006 | Saxler |
| 2006/0267029 A1 | 11/2006 | Li |
| 2009/0022193 A1* | 1/2009 | Hasegawa ......... H01L 21/28575 438/47 |
| 2009/0095973 A1 | 4/2009 | Tanaka et al. |
| 2009/0233394 A1 | 9/2009 | Batres et al. |
| 2010/0273280 A1 | 10/2010 | Batres et al. |
| 2011/0169030 A1 | 7/2011 | Li |
| 2020/0180082 A1 | 6/2020 | Tanaka et al. |

OTHER PUBLICATIONS

U.S. Appl. No. 17/229,356, filed Apr. 13, 2021, Kojima et al.
Chen-Fu Chu et al., "Study of GaN light-emitting diodes fabricated by laser lift-off technique", Journal of Applied Physics, vol. 95, No. 8, P3916, 2004.

* cited by examiner

SCANNING DIRECTION OF LASER BEAM (X)

GALLIUM NITRIDE SEMICONDUCTOR DEVICE AND METHOD FOR MANUFACTURING THE SAME

CROSS REFERENCE TO RELATED APPLICATION

The present application claims the benefit of priority from Japanese Patent Application No. 2020-073158 filed on Apr. 15, 2020. The entire disclosure of the above application is incorporated herein by reference.

TECHNICAL FIELD

The present disclosure relates to a gallium nitride semiconductor device made of gallium nitride (hereinafter, also simply referred to as GaN) and a method for manufacturing the same.

BACKGROUND

In the process of manufacturing a vertical GaN device, an epitaxial film is formed on an n type GaN substrate to form a processed wafer, a device structure is formed on the surface side of the processed wafer, and further, a surface electrode on the surface side and a back electrode on the back side of the processed wafer are formed. As a result, a vertical GaN device that allows current to flow in the vertical direction is manufactured. In order to improve the element characteristics during operation of this vertical GaN device, it is important to reduce the thermal resistance. Therefore, in the actual production of a vertical GaN device, the GaN substrate is thinned from the back surface after the surface side process for forming the device structure and the surface electrode on the front surface side of the processed wafer is performed. Then, the back electrode is formed on the back surface of the thinned GaN substrate. Further, the back electrode side of the vertical GaN device is mounted on the heat sink via the solder layer. Due to such a structure, it is necessary to reduce the contact resistance of the back electrode, to reduce the thermal resistance of the elements constituting the vertical GaN device, and to ensure the adhesiveness between the GaN and the back surface electrode even after bonding the back surface electrode on the solder layer.

SUMMARY

According to an example, a gallium nitride semiconductor device includes: a chip formation substrate made of gallium nitride and having one surface and an other surface opposite to the one surface; a one surface side element component disposed on the one surface and providing a component of an one surface side of a semiconductor element; and a metal film constituting a back surface electrode in contact with the other surface. The other surface has an irregularity provided by a plurality of convex portions with a trapezoidal cross section and a plurality of concave portions located between the convex portions; and an upper base surface of the trapezoidal cross section in each of the plurality of convex portions is opposed to the one surface.

It should be noted that in the summary immediately above, and in the rest of this disclosure (including the abstract, drawing, description, and claims), the terms "convex" and "concave" in the expressions "convex portion(s)" and "concave portion(s)" are used in a special way. The special way these terms are used is described further below. However, it should be noted these terms are not used to indicate round or curved shapes.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1A:
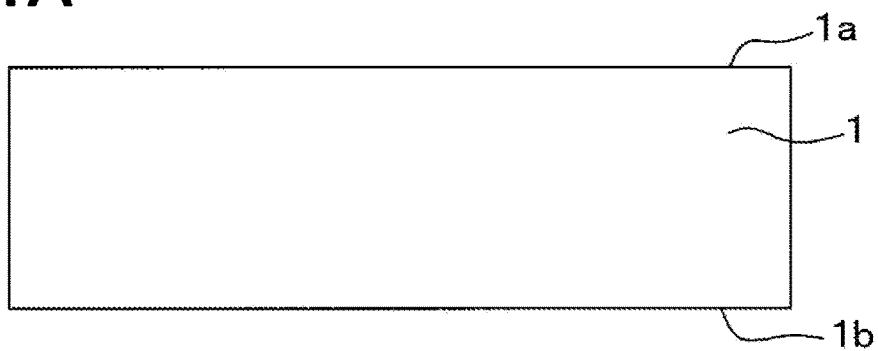
FIG. 1A is a cross-sectional view showing a manufacturing process of a semiconductor chip according to the first embodiment.

As a conceivable technique, a technique for peeling off a GaN substrate from the remaining GaN of the ingot by irradiating the GaN ingot with a laser has been studied. In this peeling technique, by performing laser irradiation, nitrogen evaporates as a gas and a transformation layer in which liquid gallium is precipitated is formed. Therefore, the GaN substrate is peeled off from the GaN ingot using the transformation layer.

The present inventors study a process using this laser irradiation peeling technique for thinning before forming the back surface electrode in the vertical GaN device, and then performing a flattening step by CMP (chemical mechanical polishing) or the like to form the back surface electrode. When the peeling technique by laser irradiation is used, the effect that the remaining part of the GaN substrate peeled after thinning can be recycled is obtained.

On the other hand, since electrodes are formed on the laser peeling surface when manufacturing the device, it is necessary to realize good backside contact resistance and to ensure adhesion so that the element does not peel off when mounted on a heat sink. However, there is a difficulty that high adhesion cannot be obtained if a flattening process for flattening the laser peeling surface is performed before the back surface electrode is formed by CMP or the like.

In view of the above points, a GaN semiconductor device capable of obtaining high adhesion of a back electrode in a vertical GaN device and a method for manufacturing the same are provided.

An example of the embodiments for achieving the above object is provided by a chip formation substrate (110) made of GaN, having one surface (110a) and another surface (110b) on the opposite side to the one surface, on which the one 15 surface side element component is formed as a component of the semiconductor device on the one surface side, and a metal film which constitutes a back surface electrode in contact with the other surface. The other surface has irregularities due to a plurality of convex portions having a trapezoidal cross section and a plurality of concave portions located between the convex portions, and the upper base surface of the trapezoidal cross section formed by each of the plurality of convex portions faces the one surface. See FIG. 8. It should be noted that in this disclosure (including the abstract, drawings, description, and claims), the terms "convex" and "concave" are used with a special meaning that is not related to round or curved shapes. Rather, the term "concave" in the expression "concave portion(s)" indicates a bent inward shape that can be filled. The term "convex" in the expression "convex portions(s)" indicates a bowed rooflike shape.

In this way, the metal film serving as the back surface electrode adheres tightly to the other surface of the chip formation substrate under a condition that the other surface has concavity and convexity. Then, by forming the convex portion of the unevenness of the other surface of the chip formation wafer to be a trapezoidal cross section and arranging the upper base surface of each of the convex portions substantially on the same plane, the height of the convex portion is made uniform and the depth of the concave portion is different from each other. Therefore, it is possible to obtain high adhesion of the back electrode in the vertical GaN device.

An example of the embodiments provides a method for manufacturing a GaN semiconductor device for providing a semiconductor element made of GaN. The method includes: preparing the GaN having one surface and the other surface opposite to the one surface; preparing the processed wafer having a plurality of chip formation regions and including a GaN wafer and an epitaxial growth film by forming the epitaxial growth film on the one surface of the GaN wafer; executing a surface side process on one surface side of the epitaxial growth film of the processed wafer as a semiconductor process for one side of the processed wafer in the semiconductor element; after executing the surface side process, dividing the processed wafer into a chip formation wafer and a recycle wafer including a GaN wafer by removing the GaN wafer from the processed wafer; and after dividing the processed wafer, forming the metal film to be a back surface electrode on the other side side of the chip formation wafer, which is the opposite side to the one surface where the surface side process is performed.

Then, in the dividing, the processed wafer is irradiated with laser light to form a transformation layer on at least one of the epitaxial growth film and the GaN wafer, and after forming the transformation layer, the processed wafer is divided into a chip formation wafer and a recycle wafer. Further, the forming of the metal film includes: after the dividing, while leaving irregularities due to a plurality of convex portions having a trapezoidal cross section and concave portions located between the convex portions on the other surface side of the chip formation wafer, flattening the upper bottom surface of the trapezoidal cross section formed by each of the plurality of convex portions so as to face one surface of the chip formation wafer; and forming a metal film on the other surface of the chip formation wafer in which the unevenness remains.

In this way, it is divided into a chip formation wafer and a recycle wafer by laser irradiation. Therefore, the recycle wafer peeled off after thinning can be recycled. Further, after the division by laser irradiation, while leaving the unevenness on the other surface side of the chip formation wafer, the plurality of convex portions have a cross-sectional trapezoidal shape, and the upper bottom surface of the cross-sectional trapezoidal shape are flattened. Then, the metal film is formed on the top.

As a result, the metal film to be the back electrode can be brought into close contact with the other surface of the chip formation substrate in a state of being uneven. Then, by forming the convex portion of the unevenness of the other surface of the chip formation wafer to be a trapezoidal cross section and arranging the upper base surface of each of the convex portions substantially on the same plane, the height of the convex portion is made uniform and the depth of the concave portion is different from each other. Therefore, it is possible to obtain high adhesion of the back electrode in the vertical GaN device.

A reference numeral in parentheses attached to each component or the like indicates an example of correspondence between the component or the like and specific component or the like described in an embodiments below.

Hereinafter, embodiments of the present disclosure will be described with reference to the drawings. In the following embodiments, the same or equivalent parts are denoted by the same reference numerals.

First Embodiment

A first embodiment will be described with reference to the drawings. Hereinafter, a method for manufacturing a GaN semiconductor device in which a semiconductor element is formed using GaN as a semiconductor material will be described.

First, as shown in FIG. 1A, a GaN wafer 1 having one surface 1a and another surface 1b and having a bulk wafer shape is prepared. For example, as the GaN wafer 1, an n type wafer having a high impurity concentration of $5 \times 10^{17}$ $cm^{-3}$ to $5 \times 10^{19}$ $cm^{-3}$, which is a dopant of silicon, oxygen, germanium, etc., is used. The thickness of the GaN wafer 1 may be arbitrary, for example, a wafer having a thickness of about 400 μm is prepared. Then, if necessary, a protection film made of an oxide film or the like may be formed on the other surface 1b or the like of the GaN wafer 1. In the GaN wafer 1 of the present embodiment, one surface 1a is a Ga surface and the other surface 1b is an N surface. Further, the GaN wafer 1 is prepared by recycling the recycle wafer 40 of FIG. 1K, which will be described later, after the manufacturing process of the semiconductor chip 100 described below is performed.

Figure 1B:
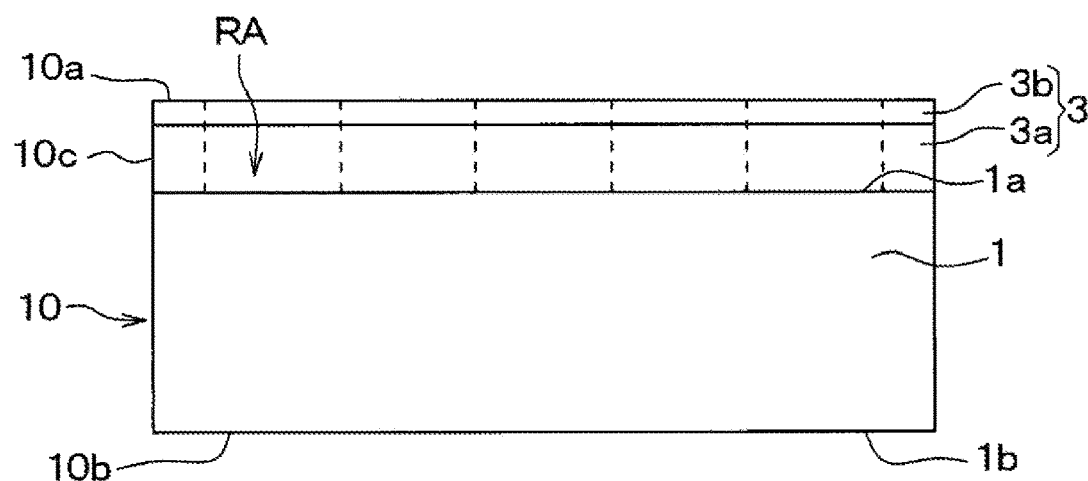
FIG. 1B is a cross-sectional view illustrating a manufacturing process of the semiconductor chip subsequent to FIG. 1A.

Next, as shown in FIG. 1B, a processed wafer 10 having a plurality of chip formation regions RA is prepared by forming an epitaxial film 3 made of GaN with a thickness of about 10 μm to 60 μm on the one surface 1a of the GaN wafer 1. In the present embodiment, the epitaxial film 3 is formed by depositing an n+ type epitaxial layer 3a corresponding to the first GaN layer and an n− type epitaxial layer 3b corresponding to the second GaN layer in order from the GaN wafer 1 side. For example, the n+ type epitaxial layer 3a is doped with silicon, oxygen, germanium, etc., and has an impurity concentration of about $5\times10^{17}$ cm$^{-3}$ to $1\times10^{18}$ cm$^{-3}$. Silicon or the like is doped in the n− type epitaxial layer 3b, and the impurity concentration is about $1\times10^{17}$ cm$^{-3}$ to $4\times10^{17}$ cm$^{-3}$. Here, the n+ type epitaxial layer 3a has an impurity concentration that makes ohmic contact with the electrode material, and has a higher impurity concentration than the n− type epitaxial layer 3b.

The n− type epitaxial layer 3b is a portion on which the one surface side element component 11 such as the diffusion layer 12, which will be described later, is formed, and has a thickness of, for example, about 8 μm to 10 μm. The thickness of the n+ type epitaxial layer 3a is, for example, about several μm to 50 μm. The thickness of the n+ type epitaxial layer 3a and the thickness of the n− type epitaxial layer 3b may be arbitrary, for example, here, the n+ type epitaxial layer 3a is thicker than the n− type epitaxial layer 3b so as to secure the thickness of the semiconductor chip 100. In the following, the surface of the processed wafer 10 on the epitaxial film 3 side is referred to as one surface 10a of the processed wafer 10, and the surface of the processed wafer 10 on the GaN wafer 1 side is referred to as the other surface 10b of the processed wafer 10. Further, the side surface 10c is defined between the one surface 10a and the other surface 10b. Each chip formation region RA is disposed on the side of the one surface 10a of the processed wafer 10.

Figure 1C:
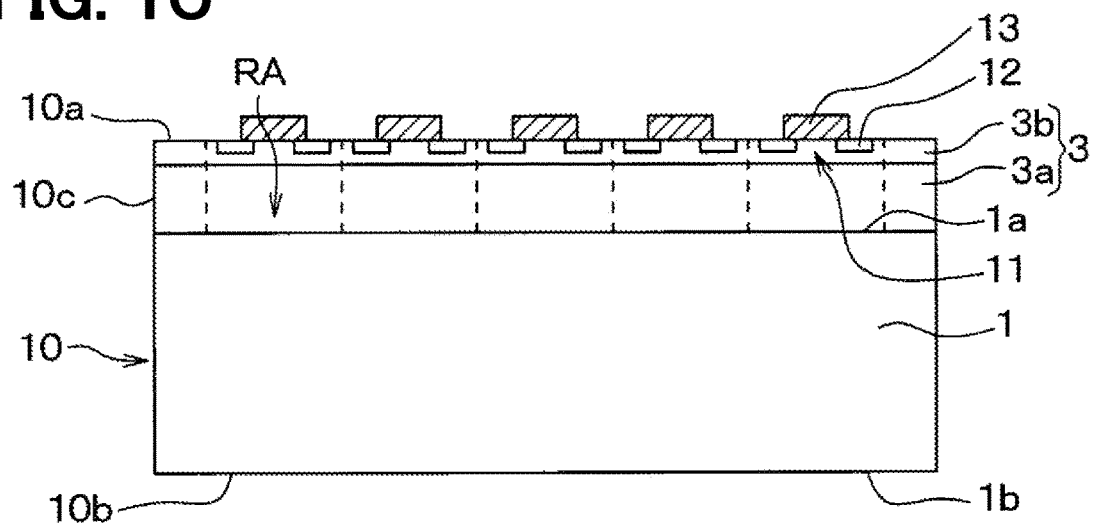
FIG. 1C is a cross-sectional view illustrating a manufacturing process of the semiconductor chip subsequent to FIG. 1B.

Next, as shown in FIG. 1C, a surface side process, which is a process for one surface 10a side of a general semiconductor manufacturing process, is performed. Specifically, as a surface-side process, a step of forming a one surface side element component 11 in a semiconductor element such as a diffusion layer 12, a gate electrode 13, a surface electrode (not shown), a wiring pattern, or a passivation film in each chip formation region RA. As the semiconductor element here, those having various configurations are adopted. For example, a power device such as a vertical MOS transistor, an optical semiconductor element such as a light emitting diode, a semiconductor laser, or the like is adopted. After that, if necessary, a surface protection film made of a resist or the like is formed on one surface 10a side of the processed wafer 10.

Figure 1D:
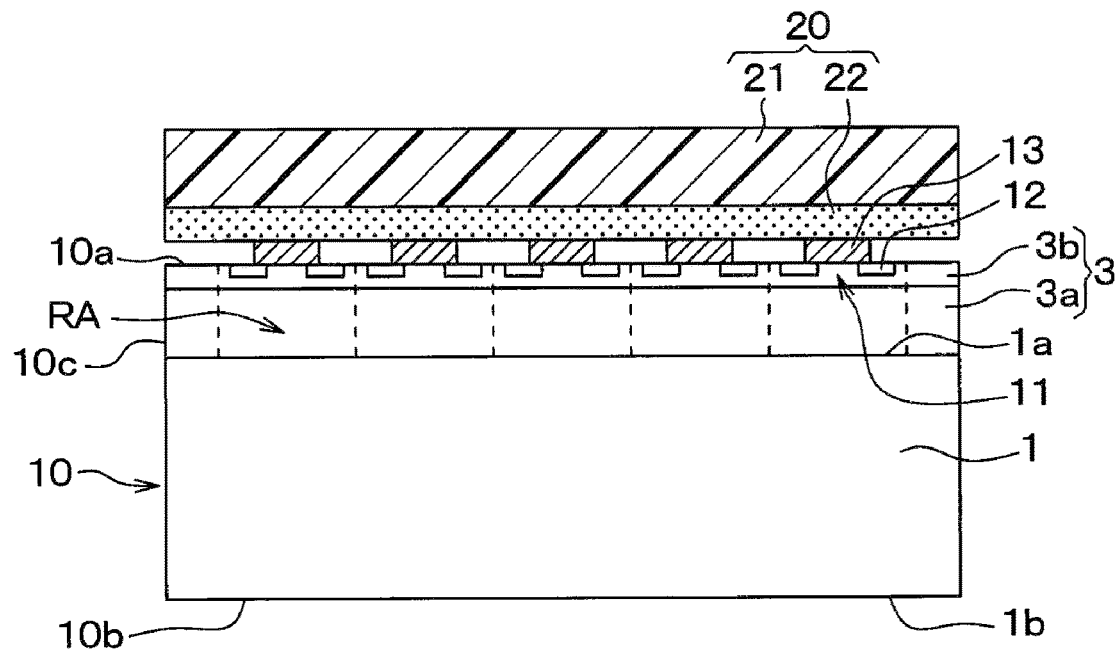
FIG. 1D is a cross-sectional view illustrating a manufacturing process of the semiconductor chip subsequent to FIG. 1C.

Subsequently, as shown in FIG. 1D, the support member 20 is arranged on the one surface 10a side of the processed wafer 10. Here, the support member 20 includes a support base 21 and an adhesive layer 22, and the support base 21 is attached to the processed wafer 10 via the adhesive layer 22. The support base 21 is for supporting the processed wafer 10 so that it can be handled even after the processed wafer 10 becomes thin, and is made of a material that does not easily warp during the manufacturing process, such as glass, a silicon substrate, and ceramics. The adhesive layer 22 may be any material as long as it can attach the support base 21 to the processed wafer 10 and peel the support base 21 from the processed wafer 10, for example, UV (Ultra Violet) cured resin, wax and double-sided tape may be used. Here, the adhesive layer 22 is a UV resin adhesive.

Figure 1E:
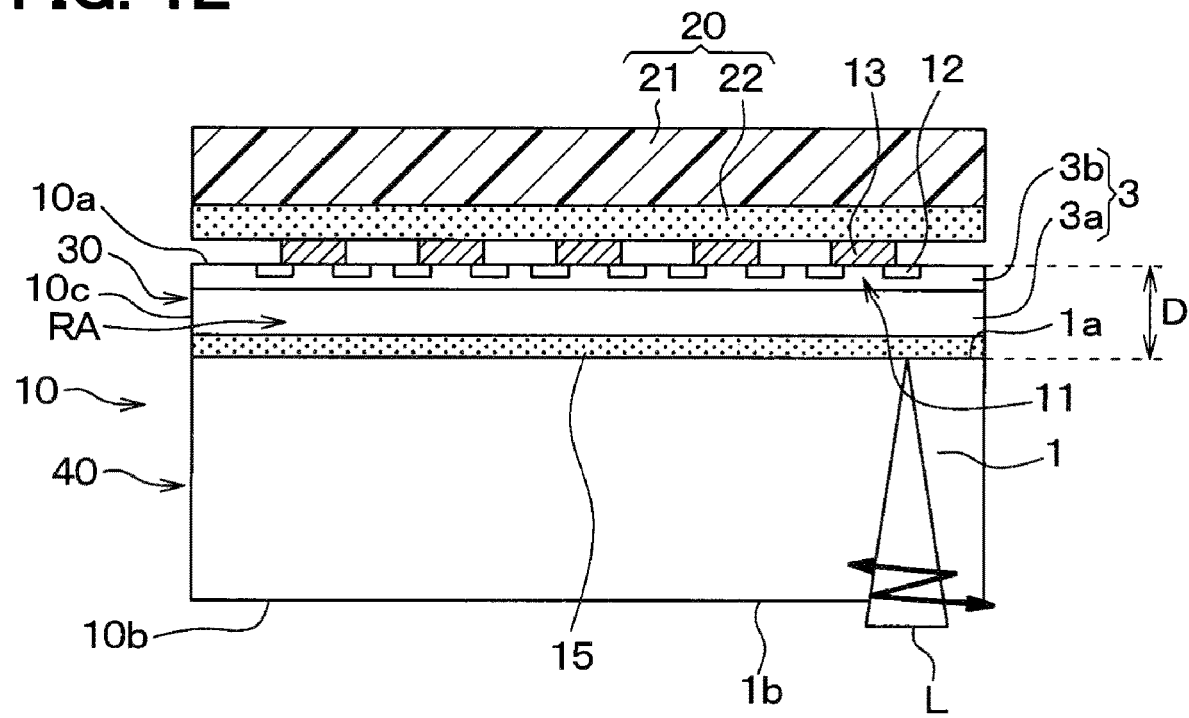
FIG. 1E is a cross-sectional view illustrating a manufacturing process of the semiconductor chip subsequent to FIG. 1D.

Subsequently, as shown in FIG. 1E, the laser beam L is irradiated from the other surface 10b of the processed wafer 10, and the wafer transformation layer 15 is formed at a position with a predetermined depth D from the one surface 10a of the processed wafer 10 along the surface direction of the processed wafer 10.

Specifically, a laser irradiation device is prepared with a laser light source that oscillates the laser beam L, a dichroic mirror arranged so as to change the direction of the optical axis (that is, the optical path) of the laser beam, a condensing lens (that is, a condensing optical system) for condensing the laser beam, a displaceable stage, and the like. Then, when the wafer transformation layer 15 is formed, the position of the stage or the like is adjusted so that the condensing point of the laser beam L is relatively scanned along the surface direction of the processed wafer 10. As a result, the wafer transformation layer 15 is formed on the processed wafer 10 along the surface direction. More specifically, by irradiating the laser beam L, the wafer transformation layer 15 is formed in which the nitrogen atom evaporates as a gas and the gallium atom is separated.

Further, although not particularly limited, in the present embodiment, when forming the wafer transformation layer 15, a solid-state laser beam having a wavelength of 532 nm of a green color laser beam is used as the laser beam L. Further, the pulse width of the laser beam L is 500 ps, the frequency is 50 kHz, and the processing speed is 500 mm/s. Then, the wafer transformation layer 15 is formed by two-step laser irradiation in which the energies of the laser light L are different so that the laser light L irradiated to the colorless and transparent GaN is absorbed.

Here, as two-step laser irradiation, a first laser irradiation that forms a large shot mark to form a Ga separation region, and a second laser irradiation that forms a small shot mark using the Ga separation region as a trigger for laser light absorption are performed. For example, when a laser irradiation device in which the laser beam L is branched at 6 points is used, if the predetermined depth D is aimed at 100 μm, the total energy of the 6-point branch is 1.6 μJ in the first laser irradiation, and 0.3 μJ in the second laser irradiation. The wafer transformation layer 15 is formed by performing two-step laser irradiation having different energies, i.e., the first laser energy irradiation and the second laser energy irradiation.

It may be effective to increase the energy of the laser beam L so that the laser beam L irradiated to the colorless and transparent GaN is suitably absorbed. Therefore, in the first laser irradiation, the laser beam L is preferably absorbed to form a large dent. However, if the energy of the laser beam L is increased to such an extent that large dents can be formed in the entire region where the wafer transformation layer 15 is formed, high energy is required in the wafer transformation layer 15 formation step. Therefore, the first laser irradiation that forms a large shot mark is combined with the second laser irradiation that forms a small shot mark with lower energy than the first laser irradiation, and the step of forming the wafer transformation layer 15 is performed so as to reduce energy. Even if the energy of the second laser irradiation is low, the absorption of the laser beam L is promoted by the Ga atom separated by the first laser irradiation, it becomes possible to form small dents, and the wafer transformation layer 15 for easy peeling off can be formed. Since the wafer transformation layer 15 can be formed not only by large dents but also by small dents, it is possible to reduce the unevenness of the peeled surface and improve the success rate of peeling.

Figure 2:
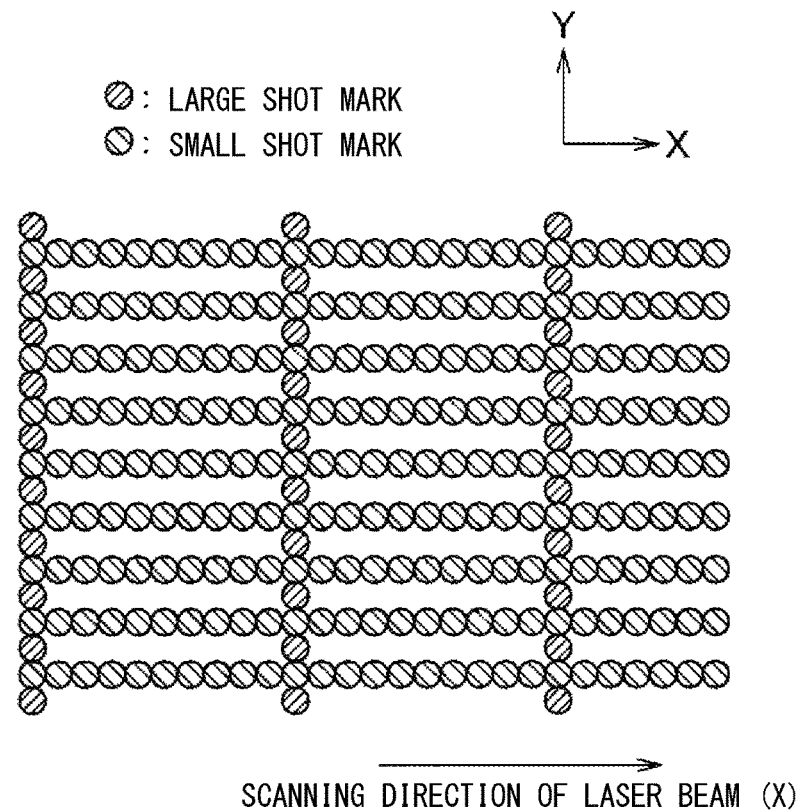
FIG. 2 is a map showing irradiation positions of laser irradiation.

For example, the irradiation positions of the first laser irradiation and the second laser irradiation are shown in the map of FIG. 2. The first laser irradiation and the second laser irradiation are performed by scanning the laser irradiation port in the laser irradiation apparatus in the X direction and the Y direction, with the left and right direction of the drawing surface being the X direction and the vertical direction of the drawing surface being the Y direction.

Figure 3:
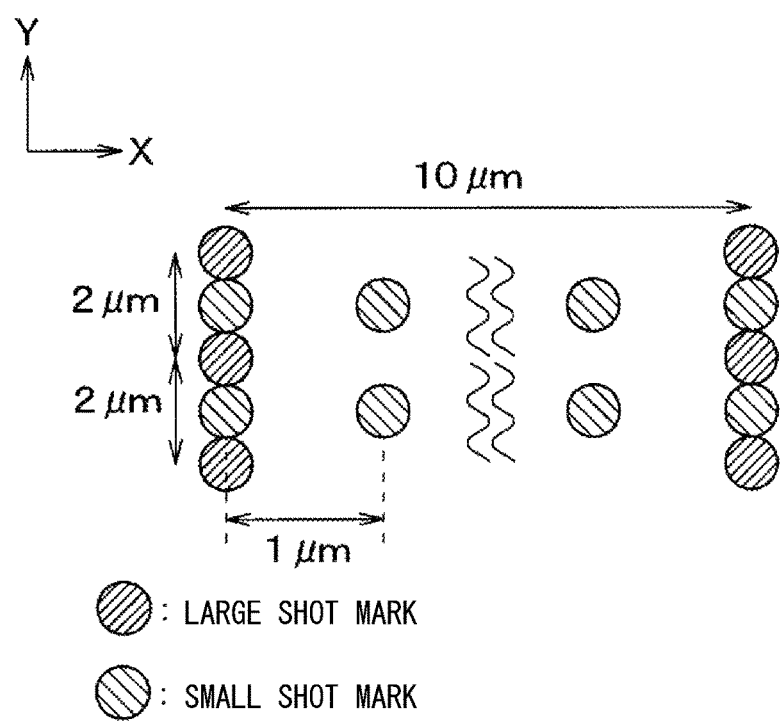
FIG. 3 is an enlarged view of a part of the irradiation position of the laser irradiation shown in FIG. 2.

Here, as the laser irradiation device, a laser beam L that is branched at 6 points in the Y direction is used, and the branching interval is 8 μm. The first laser irradiation is performed by scanning the laser irradiation port in one direction along the X direction, shifting the laser irradiation port in the Y direction by a predetermined interval, and then scanning the laser irradiation port in the X direction again. For example, as shown in FIG. 3, the first laser irradiation is performed so as to have an interval of 10 μm in the X direction and 2 μm in the Y direction so that a large shot mark is formed. Further, as shown in FIG. 2, the second laser irradiation is performed so as to fill the space between the positions where the first laser irradiation is performed. Specifically, as shown in FIG. 3, the second laser irradiation is performed at a position between positions where the first laser irradiation in the Y direction is performed, and at that position, continuously along the X direction, for example, the second laser irradiation is performed at 1 μm intervals. As a result, the second laser irradiation is performed so as to fill the space between the positions where the first laser irradiation is performed, and the second laser irradiation can make small dents in substantially the entire range of GaN.

The energy of the first laser irradiation and the second laser irradiation can be arbitrarily set. Here, the total energy is reduced by setting the energy for forming the Ga separation region in the first laser irradiation and the energy for the second laser irradiation that is difficult to be absorbed by GaN without the Ga separation region due to the first laser irradiation. For example, under the above laser conditions, the processing threshold required to form dents in colorless and transparent GaN is 1.2 μJ to 1.4 μJ in total for 6-point branches, and therefore, the first laser irradiation is performed with an energy of 6 μJ, which is slightly larger than that. Further, regarding the second laser irradiation, even if dents cannot be formed when the colorless and transparent GaN is irradiated, the energy of the second laser irradiation is 0.3 μJ, which is less than 1.2 μJ, as the small energy for forming the dents if the GaN separation region due to the first laser irradiation exists.

In this way, the large dents and the small dents are formed by performing the first laser irradiation and the second laser irradiation, but the formation positions of the large dents and the small dents are random. That is, although the first laser irradiation and the second laser irradiation are performed at the desired positions, since the laser beam L oscillates at a frequency of 50 kHz, the center positions of the large dents and the small dents are varied depending on the timing of entering the GaN, so that the positions are changed at random.

Although a 6-point branching laser irradiation device is used here, since the center positions of the branching points are aligned, the dents may be partially arranged periodically, but the arrangement of detents as a whole is random.

Although an example of the laser condition has been described above, the example shown here is just an example, and other conditions may be used. The present inventors confirms that the wafer transformation layer 15 is appropriately formed even when the processing point output of the laser beam L is further lower, the pulse width is further shorter, or the wavelength other than the above, for example, when the laser beam L is infrared. Further, the present inventors confirm that the wafer transformation layer 15 is appropriately formed even when the processing point output of the laser beam L is higher or the pulse width is longer.

Further, the case where 100 μm is aimed as the predetermined depth D when forming the wafer transformation layer 15 is described as an example, alternatively, the predetermined depth D is set according to the ease of handling and the withstand voltage of the semiconductor chip 100. It is about 10 μm to 200 μm. In this case, the location of the wafer transformation layer 15 is changed according to the thickness of the epitaxial film 3, and the layer 15 is formed at least in the epitaxial film 3, at the boundary between the epitaxial film 3 and the GaN wafer 1, or in the GaN wafer 1. Note that FIG. 1E shows an example in which the wafer transformation layer 15 is formed at the boundary between the epitaxial film 3 and the GaN wafer 1.

Here, as will be described later, at least a part of the GaN wafer 1 in the processed wafer 10 is recycled as the recycle wafer 40. Therefore, the wafer transformation layer 15 may be preferably formed inside the epitaxial film 3 or at the boundary between the epitaxial film 3 and the GaN wafer 1. When the wafer transformation layer 15 is formed inside the GaN wafer 1, the wafer transformation layer 15 may be preferably formed on one surface 1a side of the GaN wafer 1.

When the wafer transformation layer 15 is formed inside the epitaxial film 3, the wafer transformation layer 15 is formed inside the n$^+$ type epitaxial layer 3a instead of the n$^-$ type epitaxial layer 3b constituting the semiconductor element. In the following, the portion of the processed wafer 10 on the one surface 10a side of the wafer transformation layer 15 is referred to as the chip formation wafer 30, and the portion of the processed wafer 10 on the other surface 10b side of the wafer transformation layer 15 is referred to as the recycle wafer 40.

Figure 1F:
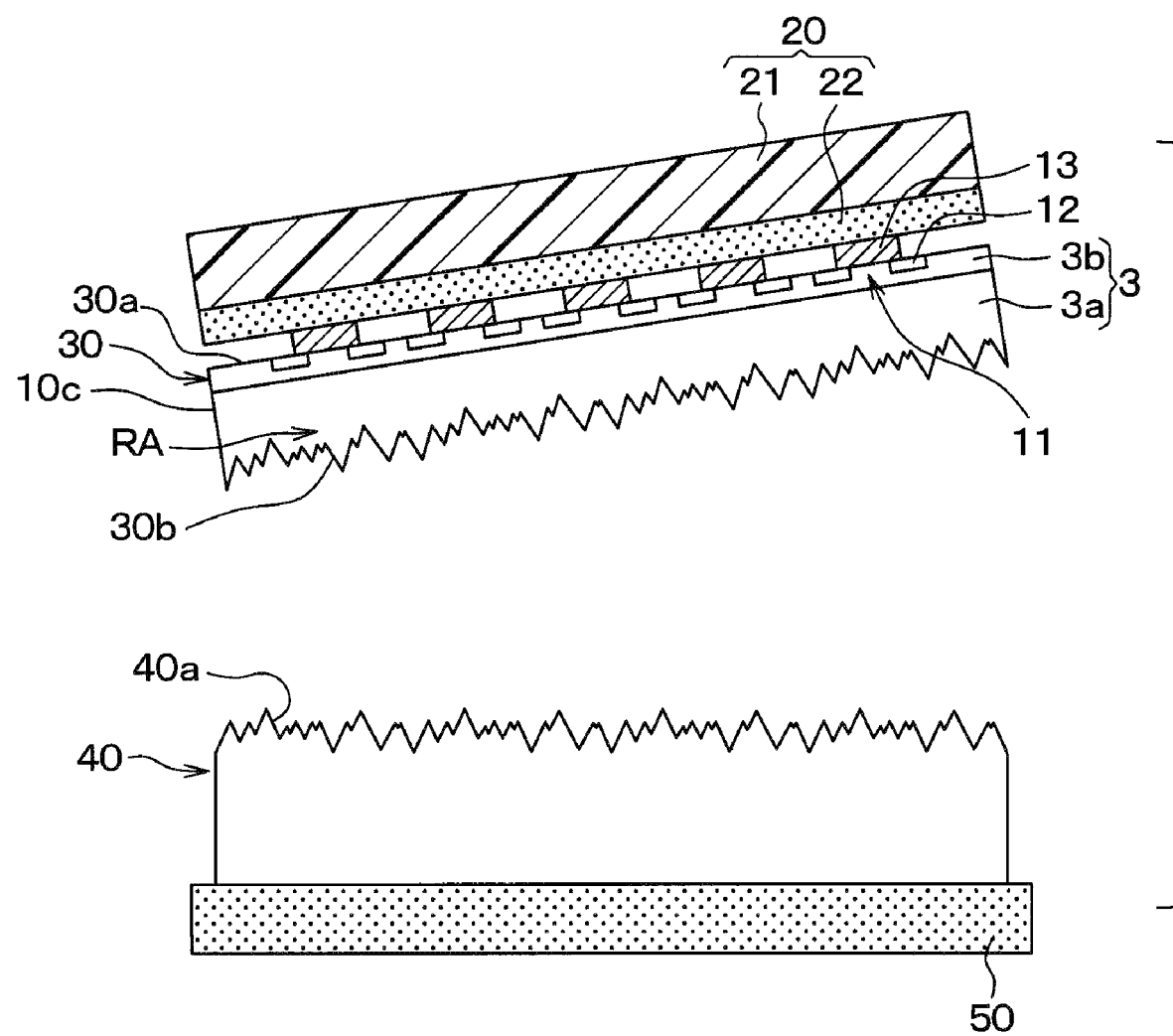
FIG. 1F is a cross-sectional view illustrating a manufacturing process of the semiconductor chip subsequent to FIG. 1E.

Next, as shown in FIG. 1F, the auxiliary member 50 is arranged on the other surface 10b side of the processed wafer 10. Although the auxiliary member 50 is shown in a simplified manner in FIG. 1F, it includes, for example, a base material and an adhesive whose adhesive strength can be changed. In this case, the base material in the auxiliary member 50 is made of, for example, glass, a silicon substrate, ceramics, etc., and the adhesive in the auxiliary member 50 is made of, for example, an ultraviolet curable resin, wax, double-sided tape, or the like. Then, the support member 21 and the auxiliary member 50 are gripped and a tensile force or the like is applied in the thickness direction of the processed wafer 10, and the wafer is divided into the chip formation wafer 30 and the recycle wafer 40 at the wafer transformation layer 15 as a boundary (that is, the starting point of branching). That is, the GaN wafer 1 is peeled from the n$^+$ type epitaxial layer 3a at the wafer transformation layer 15. At this time, as described above, the wafer transformation layer 15 is formed by irradiating GaN with a laser, a nitrogen atom evaporates as a gas, and a gallium atom is separated out. Therefore, it is divided into the chip formation wafer 30 and the recycle wafer 40 by applying a tensile force or the like.

In the following, the surface of the chip formation wafer 30 on which the one surface side element component 11 is formed is designated as the one surface 30a, and the divided surface side of the chip formation wafer 30 is referred to as the other surface 30b. The divided surface side of the recycle wafer 40 will be described as one surface 40a. Further, in each of the drawings after FIG. 1G, the wafer transformation layer 15 and the like remaining on the other surface 30b of the chip formation wafer 30 and the one surface 40a of the recycle wafer 40 are appropriately not shown.

Figure 1G:
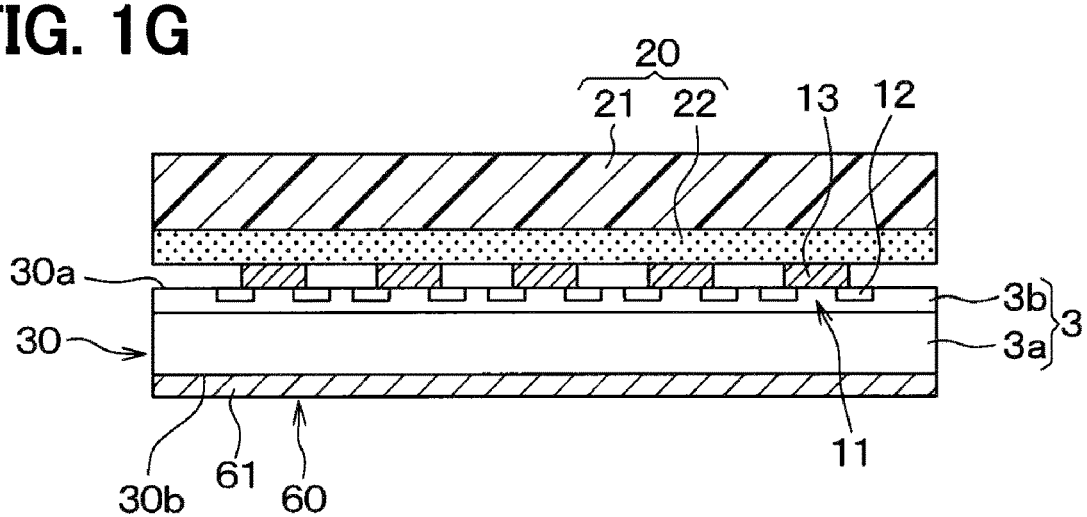
FIG. 1G is a cross-sectional view illustrating a manufacturing process of the semiconductor chip sequent to FIG. 1F.

After that, as shown in FIG. 1G, as the remaining semiconductor manufacturing process, the other surface side element component 60 of the semiconductor element such as the metal film 61 for forming the back surface electrode is formed on the other surface 30b of the chip formation wafer 30 in the back side process. For the metal film 61, an n type GaN constituting the other surface 30b, that is, a material capable of ohmic contact with the $n^+$ type epitaxial layer 3a or the GaN wafer 1 is used, and for example, Ti/Al/Ni/Au is used. Alternatively, V/Al/Ni/Au or the like in which Ti is replaced with V may be used.

Figure 4A:
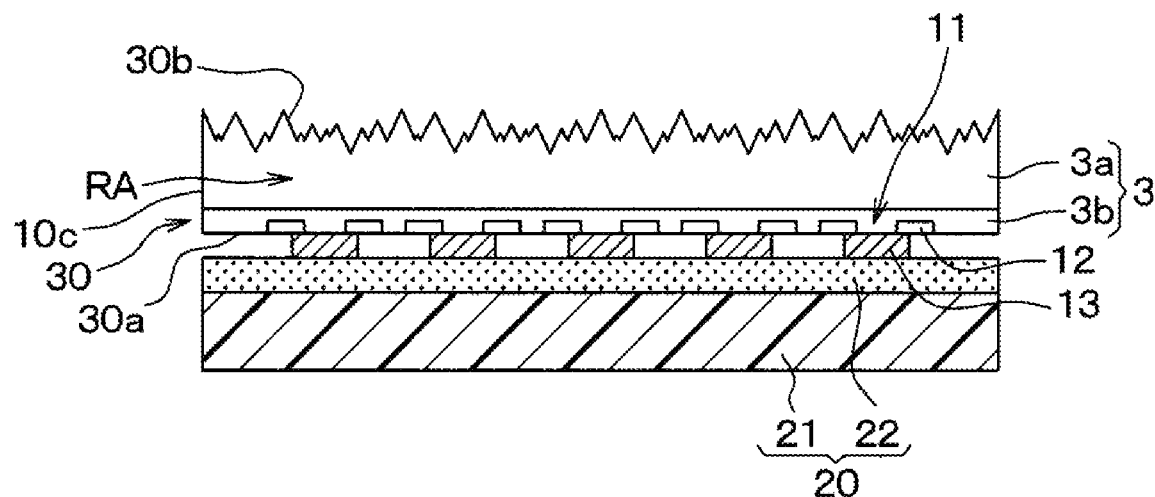
FIG. 4A is an exaggerated view of a cross section of another surface of a chip formation wafer before a flattening step.

Before the step of forming the other surface side element component 60, a flattening step of flattening the other surface 30b of the chip formation wafer 30 by a CMP (abbreviation of chemical mechanical polishing) method or the like may be performed. Further, if necessary, it may be preferable to perform a cleaning step after the flattening step to clean the surface of the other surface 30b. FIG. 4A exaggerates the cross section of the other surface 30b before the flattening step, and FIG. 4B exaggerates the cross section of the other surface 30b after the flattening step.

As shown in FIG. 4A, in the state before the flattening step, the other surface 30b is constituted by a large number of randomly sized convex portions having a triangular cross section and concave portions having a triangular cross section formed between the convex portions. This is because the recycle wafer 40 is peeled from the chip formation wafer 30 by laser irradiation. As described above, when laser irradiation is performed, nitrogen evaporates as a gas by forming large dents and small dents, and Ga is precipitated to form a wafer transformation layer 15. The recycle wafer 40 is peeled from the chip formation wafer 30 by the wafer transformation layer 15. Therefore, the other surface 30b of the chip formation wafer 30 is in a state in which irregularities due to large dents and small dents are formed, so that the irregularities have a triangular cross section. The depth of the unevenness is different for each place and has various depths, and the deep and shallow ones are mixed, and the height of the unevenness is random. This is because the laser beam L oscillates during laser irradiation to form large dents and small dents at random positions, and large dents and small dents are formed at random positions, resulting that the height of unevenness is also random. In addition, the height of the unevenness becomes more random because the distortion at the time of peeling by the wafer transformation layer 15 remains.

When the completed GaN semiconductor device is used, for example, the back electrode side formed of the metal film 61 is mounted on the heat sink via the solder layer. Due to such a structure, it is necessary (1) to reduce the contact resistance of the back electrode, (2) to reduce the thermal resistance of the elements constituting the vertical GaN device, and (3) to ensure the adhesiveness between the GaN and the back surface electrode even after bonding the back surface electrode on the solder layer.

In order to reduce the contact resistance of the back electrode, it may be preferable that the contact area between the other surface 30b and the metal film 61 is large. In order to increase the contact area, it may be preferable that the other surface 30b is not a flat surface but has irregularities. In this respect, it may be possible to increase the contact area because the other surface 30b has irregularities in the state where it is peeled off at the wafer transformation layer 15 simply by laser irradiation. However, if the height of the unevenness is random, the wraparound of the solder to the place where the convex portion is low becomes poor. Therefore, when the completed GaN semiconductor device is mounted on the heat sink via the solder layer, the adhesion between the other surface 30b and the back electrode may decrease. Further, if the height of the unevenness is random, when the chips are fixed with solder, the height from the heat sink to the surface of the chips differs for each chip, and the assembly yield may decrease.

Figure 4B:
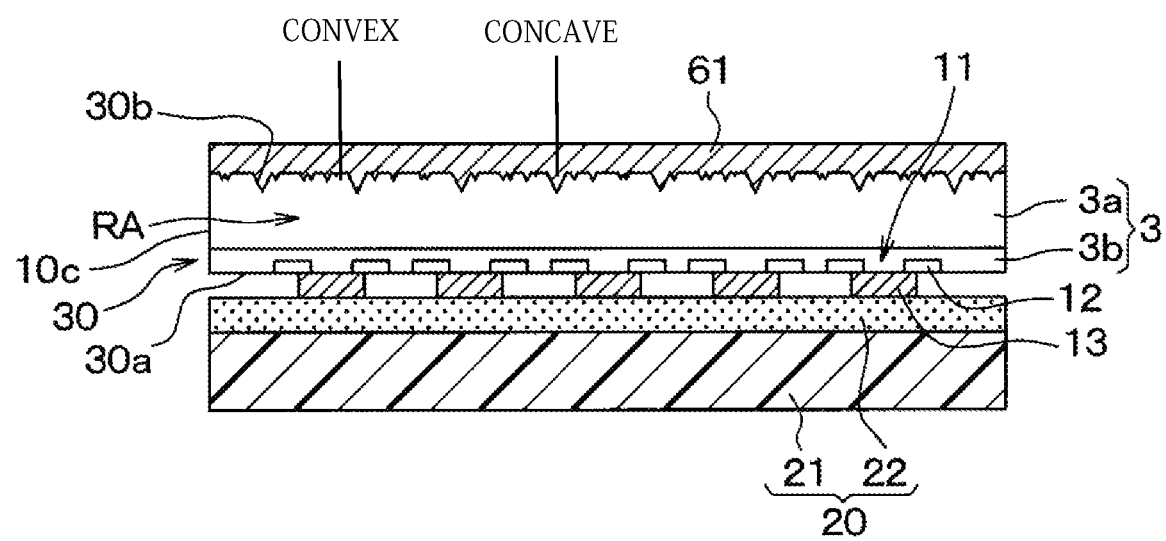
FIG. 4B is an exaggerated view of a cross section of the other surface of the chip formation wafer after the flattening step.

On the other hand, when the flattening step by CMP or the like is performed as in the present embodiment, it is possible to make the heights of the unevenness of the other surface 30b uniform as shown in FIG. 4B. Specifically, through the flattening step, the other surface 30b includes a large number of random sized convex portions having a trapezoidal cross section and concave portions having a triangular cross section formed between the convex portions. The surface of the upper base, which is the tip of each convex portion having a trapezoidal cross section, is substantially on the same plane and faces substantially parallel to one surface 30a, and the depth of the concave portion is random, but the height of each convex portion is aligned. As a result of confirmation by experiment, the height of the convex portion, in other words, the depth of the concave portion from the upper bottom is in the range of 5 μm to 30 μm, and the upper bottom of each convex portion is disposed substantially on the same plane. Regarding the convex portion with a low height, the one with a triangular cross section remains, but the height is less than the height of the concave portion having a trapezoidal cross section, so that the convex portion is in a state of being located inside from the upper bottom of the convex portion having a trapezoidal cross section.

In this way, while performing the flattening step, the unevenness is left on the other surface 30b even after the flattening step, so that the contact area between the other surface 30b and the metal film 61 can be increased. Further, since the depth of the recess is random, the portion of the metal film 61 that enters the concavity portion functions as a wedge having a different height, and high adhesion can be obtained. In particular, the side surface of each convex portion is not flattened so much, and fine surface roughness due to nitrogen vacancies and dents caused by the laser irradiation remains. Therefore, contact area between the other surface 30b and the metal film 61 becomes larger and higher adhesion can be obtained. Therefore, it becomes possible to reduce the thermal resistance of the elements constituting the vertical GaN device, and the above-mentioned (2) is realized. Further, since the heights of the convex portions on the other surface 30b can be made uniform, the adhesion between the other surface 30b and the metal film 61 can be suppressed from decreasing when the completed GaN semiconductor device is mounted on the heat sink via the solder layer. Thus, the above-mentioned (3) is also realized.

Further, when the flattening step is performed by CMP, more preferably when the cleaning step is performed after the CMP, the liquid-like Ga is removed from the surface of the other surface 30b and disappears. For this reason, the GaN without Ga intervening and the metal film 61 are in close contact with each other, and the adhesion between the other surface 30b and the metal film 61 can be further improved. Further, when Ga is present, the contact resistance is increased based on the work function difference between Ga and the metal film 61, but the contact resistance may be reduced by the contact between the GaN and the metal film 61 without Ga intervening. Therefore, the above-mentioned (1) and (3) are more realized.

Further, since the surface of the other surface 30b is made of GaN without Ga intervening, that is, it is made of an n type layer formed of an $n^+$ type epitaxial layer 3a having a high impurity concentration, the back surface electrode has a small contact resistance, and is provided by an n type electrode that is in ohmic contact. Further, the large contact area between the other surface 30b and the metal film 61 also contributes to the reduction of the contact resistance of the back electrode. Therefore, the above-mentioned (1) is also realized.

Note that FIG. 1G shows a state after flattening the other surface 30b of the chip formation wafer 30, and although it is a flat surface without unevenness in the drawing, as described above, the other surface 30b has actually minute irregularities.

Figure 1H:
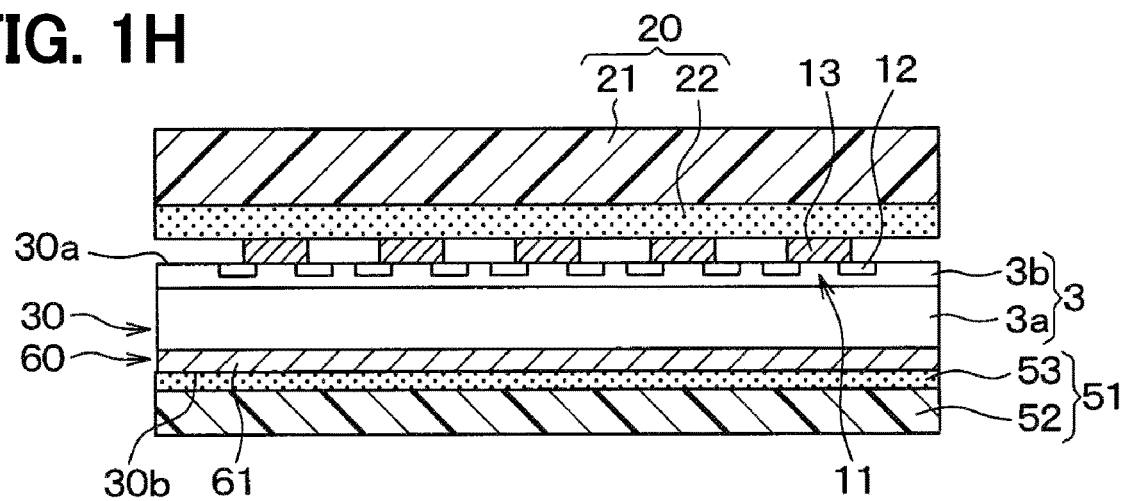
FIG. 1H is a cross-sectional view illustrating a manufacturing process of the semiconductor device subsequent to FIG. 1G.

Subsequently, as shown in FIG. 1H, the holding member 51 is arranged on the other surface 30b side of the chip formation wafer 30, that is, on the metal film 61 side. As the holding member 51, for example, a dicing tape or the like having a base material 52 and an adhesive 53 is used. The adhesive 53 is made of a material whose adhesive strength can be changed. For example, an adhesive whose adhesive strength changes depending on temperature or light is used.

Figure 1I:
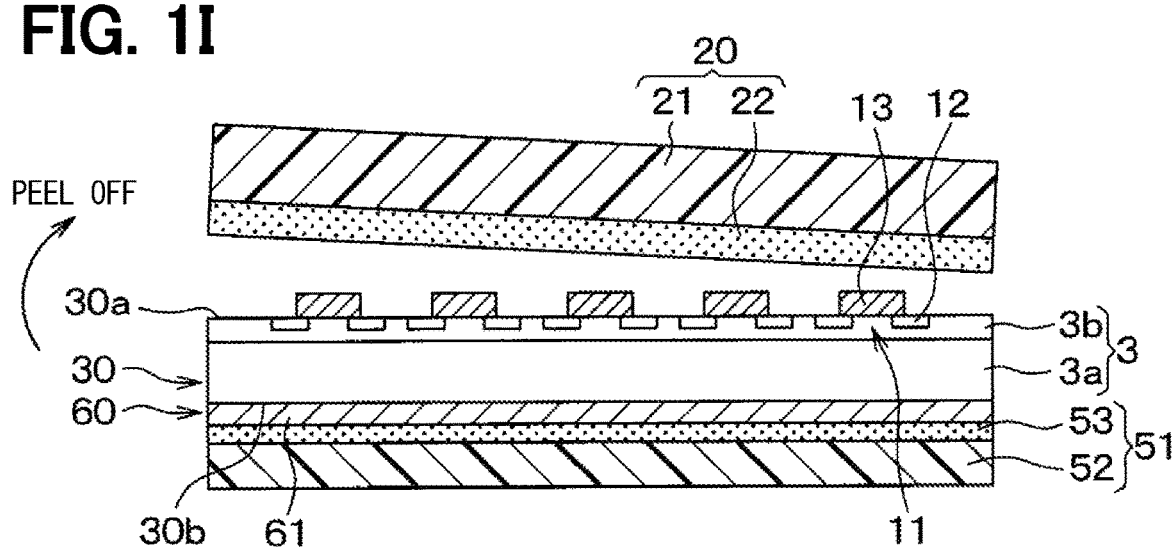
FIG. 1I is a cross-sectional view illustrating a manufacturing process of the semiconductor chip subsequent to FIG. 1H.
Figure 1J:
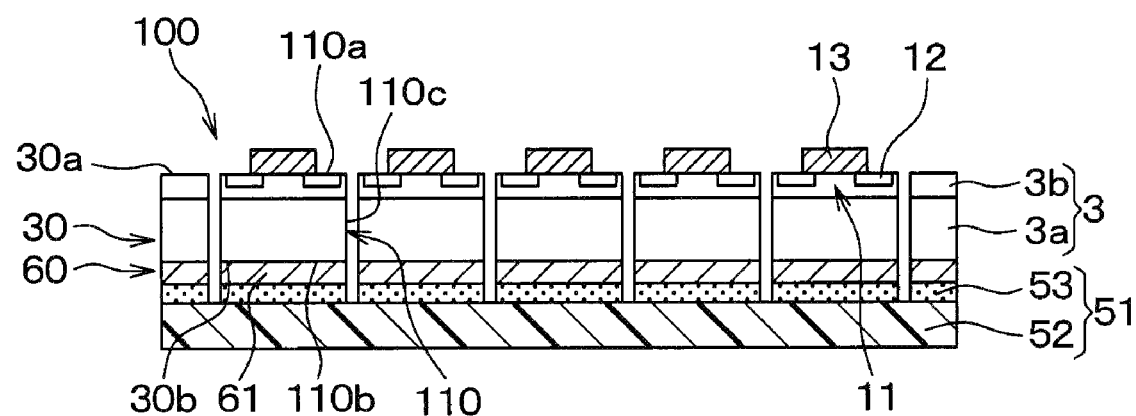
FIG. 1J is a cross-sectional view illustrating a manufacturing process of the semiconductor chip subsequent to FIG. 1I.

After that, as shown in FIG. 1I, the support base 21 attached to the other surface 30b side of the chip formation wafer 30 is peeled off. Here, a process of reducing the adhesive force of the adhesive layer 22 that attaches the support base 21 to the chip formation wafer 30, for example, UV irradiation is performed when the adhesive layer 22 is made of a UV resin adhesive.

Subsequently, as shown in FIG. 13, each semiconductor chip 100 is configured by individualizing the chip formation wafer 30 into chip units by a dicing saw, laser dicing, or the like. At this time, the dicing depth is adjusted so that the holding member 51 remains connected without being cut while the chip formation wafer 30 is divided into chip units.

Although the subsequent steps are not shown, the holding member 51 is expanded and the distance between the semiconductor chips 100 is widened at the dicing cut portion. After that, the adhesive force of the adhesive 53 is weakened by heat treatment or irradiation with light, and the semiconductor chip 100 is picked up. As a result, the semiconductor chip 100 is manufactured.

Further, the semiconductor chip 100 manufactured as described above and made of GaN includes a chip formation substrate 110 having one surface 110a, another surface 110b on the opposite side to the one surface, and a side surface 110c connecting the one surface 110a and the other surface 110b. The one surface 110a and the other surface 110b of the chip formation substrate 110 correspond to the one surface 30a and the other surface 30b in the chip formation wafer 30. Further, the chip formation substrate 110 has an epitaxial film 3 made of GaN, the one surface side element component 11 is formed on the one surface 110a side, and the other surface side element component 60 is formed on the other surface 110b side.

Figure 1K:
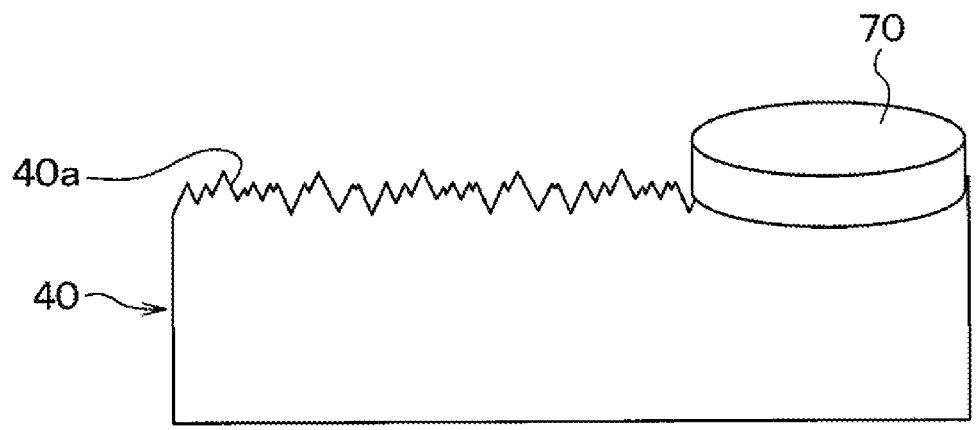
FIG. 1K is a cross-sectional view showing a manufacturing process of a recycle wafer subsequent to FIG. 1F.

Further, as shown in FIG. 1K, the one surface 40a of the recycle wafer 40 configured in FIG. 1F is flattened by performing a CMP method using a polishing apparatus 70 or the like on the one surface 40a. Then, the flattened recycle wafer 40 is used as the GaN wafer 1, and the steps after FIG. 1A are performed again. As a result, the GaN wafer 1 can be used a plurality of times to form the semiconductor chip 100.

As described above, the semiconductor chip 100 constituting the GaN semiconductor device can be manufactured. In the semiconductor chip 100 manufactured in this manner, the metal film 61 serving as the back surface electrode is in close contact with the other surface 110b of the chip formation substrate 110 in a state of having irregularities. Then, by forming the convex portion of the unevenness of the other surface 110b to be a trapezoidal cross section and arranging the upper base surface of each of the convex portions substantially on the same plane, the height of the convex portion is made uniform and the depth of the concave portion is different from each other.

Due to such a structure, it is possible (1) to reduce the contact resistance of the back electrode, (2) to reduce the thermal resistance of the elements constituting the vertical GaN device, and (3) to ensure the adhesiveness between the GaN and the back surface electrode even after bonding the back surface electrode on the solder layer.

Figure 5A:
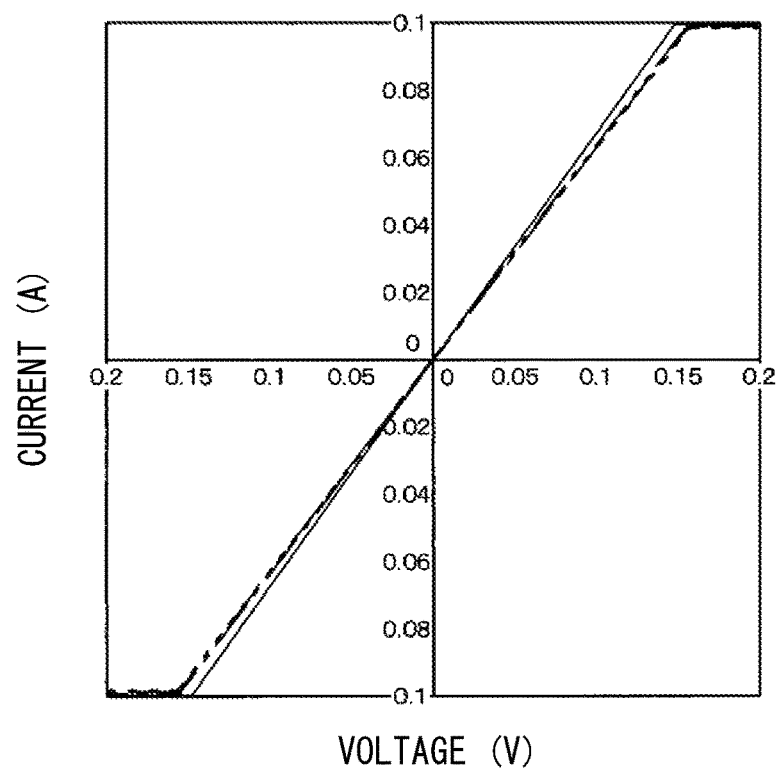
FIG. 5A is a diagram showing I-V characteristics of a semiconductor chip constituting the GaN semiconductor device of the first embodiment.
Figure 5B:
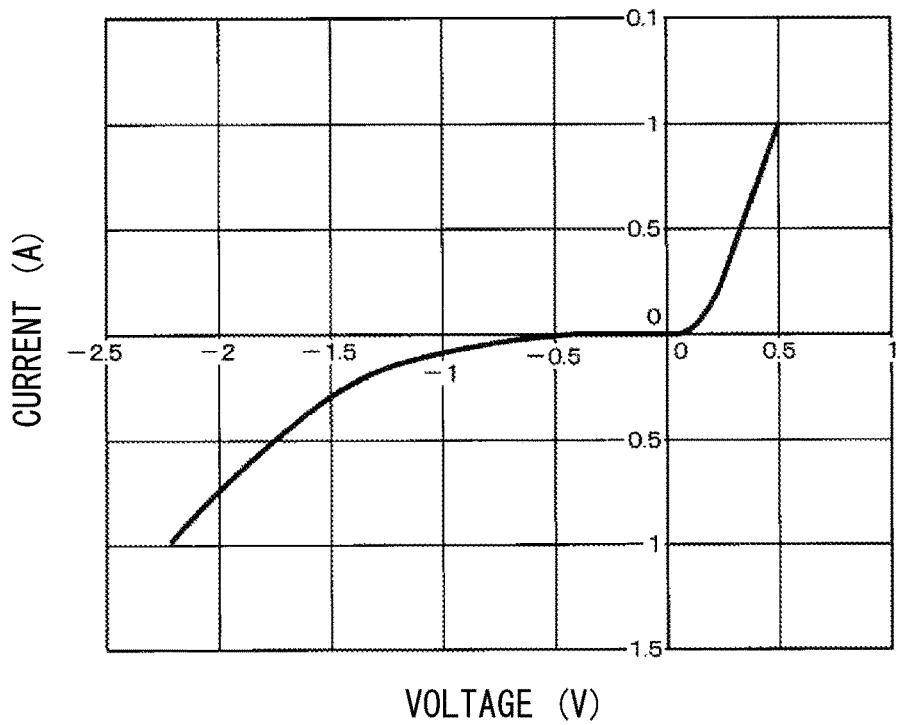
FIG. 5B is a diagram showing I-V characteristics of a semiconductor chip constituting a GaN semiconductor device in a comparative example.
Figure 6:
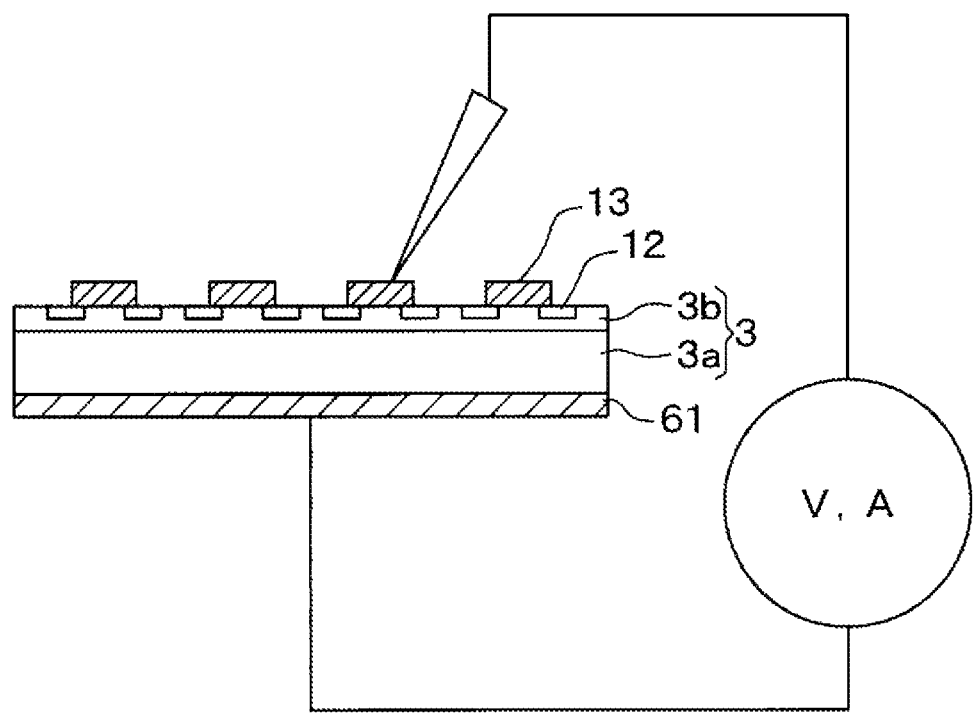
FIG. 6 is a schematic diagram of an I-V evaluation system for evaluating the I-V characteristics shown in FIGS. 5A and 5B.

Specifically, as a comparative example with the semiconductor chip 100 constituting the GaN semiconductor device obtained as in the present embodiment, the IV characteristics are obtained for each of the cases where the other surface 110b is a flat surface having almost no unevenness as in the conventional case. As a result, the results shown in FIGS. 5A and 5B are obtained. In this experiment, as shown in FIG. 6, an IV evaluation system is used such that a sample peeled off from the holding member 51 is prepared after performing the step of FIG. 1I, and the source current flowing when a gate voltage is applied is measured.

When the other surface 110b is a flat surface as in the comparative example, if the metal film 61 is simply formed on the surface of the other surface 110b, the adhesion between the other surface 110b and the metal film 61 is low, and the contact resistance cannot be lowered as well as the low adhesion contact. Further, since the annealing treatment described later is not performed, the other surface 110b is in a state where the flattening step has been performed, and the damage layer generated during the flattening step remains, so that the contact resistance becomes higher. Therefore, as shown in FIG. 5B, the IV characteristic exhibits an exponential characteristic similar to Schottky contact.

On the other hand, as in the present embodiment, when the metal film 61 to be the back surface electrode is brought into close contact with the other surface 110b having irregularities, the IV characteristics are proportional as shown in FIG. 5A. This means that the other surface 110b and the metal film 61 are in close contact with each other, and the contact resistance of the back surface electrode can be reduced. Even in the case of this embodiment, since the flattening step is performed, it is considered that the damage layer remains on the upper base surface of the convex portion of the other surface 110b, but the damage layer is not formed in the concave portion so much, and it is considered that high adhesion and low contact resistance are achieved.

As described above, according to the GaN semiconductor device of the present embodiment, high adhesion between the other surface 110b and the metal film 61 can be obtained, and the contact resistance of the back surface electrode can be reduced, and therefore, the excellent I-V characteristics can be obtained. Further, since high adhesion between the other surface 110b and the metal film 61 can be obtained, it is possible to reduce the thermal resistance of the elements constituting the vertical GaN device.

Other Embodiments

Although the present disclosure is made with reference to the embodiments described above, the present disclosure is not limited to such embodiments but may include various changes and modifications which are within equivalent ranges. In addition, while various combinations and configurations, which are preferred, other combinations and configurations including further only a single element, more or less, are also within the spirit and scope of the present disclosure.

For example, in the first embodiment, as a step of forming the other surface side element component 60, the metal film 61 is only formed after the flattening step is performed on the other surface 30b, alternatively, an annealing treatment may be performed after the metal film 61 is formed. That is, in the first embodiment, the non-alloy metal film 61 and the other surface 30b are brought into close contact with each other without annealing, alternatively, the metal film 61 and the other surface 30b may be brought into close contact with each other via the boundary reaction layer made of the alloy by reacting the other surface 30b and the metal film 61 with performing an annealing step. For example, when Ti/Al/Ni/Au is used as the metal film 61, a boundary reaction layer made of titanium nitride (TiNx) or gallium titanate (Ti3Ga) is formed. As a result, it becomes possible to further improve the adhesion and reduce the contact resistance of the back electrode.

Here, when the annealing treatment is performed after the surface side process, it may not be preferable to perform the annealing treatment on the entire processed wafer 10 because it may cause heat damage to the one surface side element component 11. In consideration of this, it may be preferable that the annealing treatment is local heating by laser annealing.

Since high adhesion can be obtained even when the annealing treatment is not performed as in the first embodiment, in that case, the manufacturing process can be simplified because the annealing treatment is not performed. On the contrary, when the annealing treatment is performed, the number of manufacturing steps increases, but higher adhesion can be obtained. When the annealing treatment is performed, the boundary reaction layer is formed, but the unevenness of the surface of the other surface 30b remains.

Further, in the above embodiment, the laser irradiation with 6-point branching is performed, alternatively, a laser irradiation device capable of branching to less than 6 points or more than 6 points may be used. Further, the position where the first laser irradiation is performed and the position where the second laser irradiation is performed, which are mentioned in the above embodiment, are only shown as an example, and the laser irradiation may be performed at different positions.

For example, in each of the above embodiments, the epitaxial film 3 may be made of only the n⁻ type epitaxial layer 3a.

Further, in each of the above embodiments, in the step of forming the epitaxial film 3 of FIG. 1B, the epitaxial film may be formed on the other surface 1b side of the GaN wafer 1. According to this, for example, even when the wafer transformation layer 15 is formed in the GaN wafer 1, it becomes easy to remain a thickness equal to or more than a predetermined thickness as the recycle wafer 40, and the number of times that the recycle wafer can be recycled can be increased.

Further, in the first and second embodiments, the step of forming the wafer transformation layer 15 of FIG. 1E may be performed before the step of arranging the support member 20 of FIG. 1D. In this case, the laser beam L may be irradiated from the one surface 10a of the processed wafer 10. Here, when the laser beam L is irradiated from the one surface 10a of the processed wafer 10, the position of the condensing point of the laser beam L may vary depending on the surface electrode, the wiring pattern, or the like formed on the one surface 10a side. Therefore, it may be preferable to irradiate the laser beam from the other surface 10b of the processed wafer 10.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A gallium nitride semiconductor device comprising:
a chip formation substrate made of gallium nitride and having one surface and an other surface opposite to the one surface;
a one surface side element component disposed on the one surface and providing a component of an one surface side of a semiconductor element; and
a metal film constituting a back surface electrode in contact with the other surface, wherein:
the other surface has an irregularity provided by
a plurality of convex portions with a trapezoidal cross section and
a plurality of concave portions located between the convex portions;
an upper base surface of the trapezoidal cross section in each of the plurality of convex portions is opposed to the one surface; and
a maximum depth of some of the concave portions vary.

2. The gallium nitride semiconductor device according to claim 1, wherein:
a height of each of the plurality of convex portions from an adjacent concave portion is in a range between 5 μm and 30 μm.

3. The gallium nitride semiconductor device according to claim 1, wherein:
a surface of each of the concave portions includes a surface roughness provided by a nitrogen vacancy and a laser irradiation mark.

4. The gallium nitride semiconductor device according to claim 1, wherein:
the other surface of the chip formation substrate in contact with the metal film is made of n type gallium nitride.

5. The gallium nitride semiconductor device according to claim 4, wherein:
a portion of the metal film in contact with the other surface is made of a metal that provides an ohmic contact with n type gallium nitride.

6. The gallium nitride semiconductor device according to claim 1, wherein:
no liquid gallium exists between the other surface and the metal film.

7. The gallium nitride semiconductor device according to claim 1, wherein:
   some parts of the metal film entering the concave portions provide wedges having different maximum heights.

8. The gallium nitride semiconductor device according to claim 1, wherein: a side surface of each convex portion has a surface roughness finer than a predetermined value due to a nitrogen vacancy and a dent.

* * * * *